United States Patent
Vanagas et al.

(10) Patent No.: US 10,074,565 B2
(45) Date of Patent: Sep. 11, 2018

(54) METHOD OF LASER PROCESSING FOR SUBSTRATE CLEAVING OR DICING THROUGH FORMING "SPIKE-LIKE" SHAPED DAMAGE STRUCTURES

(71) Applicant: EVANA TECHNOLOGIES, UAB, Vilnius (LT)

(72) Inventors: Egidijus Vanagas, Vilnius (LT); Dziugas Kimbaras, Vilnius (LT); Laurynas Veselis, Klaipeda (LT)

(73) Assignee: EVANA TECHNOLOGIES, UAB, Vilnius (LT)

( * ) Notice: Subject to any disclaimer, the term of this patent is extended or adjusted under 35 U.S.C. 154(b) by 0 days.

(21) Appl. No.: 15/512,189

(22) PCT Filed: Oct. 13, 2014

(86) PCT No.: PCT/IB2014/065274
§ 371 (c)(1),
(2) Date: Mar. 17, 2017

(87) PCT Pub. No.: WO2016/059449
PCT Pub. Date: Apr. 21, 2016

(65) Prior Publication Data
US 2017/0250113 A1    Aug. 31, 2017

(51) Int. Cl.
*H01L 21/78* (2006.01)
*B23K 26/00* (2014.01)
(Continued)

(52) U.S. Cl.
CPC .......... *H01L 21/78* (2013.01); *B23K 26/0006* (2013.01); *B23K 26/0057* (2013.01); *B23K 26/0624* (2015.10); *B23K 2203/52* (2015.10)

(58) Field of Classification Search
CPC .. H01L 21/78; B23K 26/0057; B23K 26/0624
See application file for complete search history.

(56) References Cited

U.S. PATENT DOCUMENTS

2013/0126573 A1    5/2013    Hosseini et al.

FOREIGN PATENT DOCUMENTS

WO    WO-2014079570 A1    5/2014

OTHER PUBLICATIONS

Bhuyan et al, "High Aspect Ratio Nanochannel Machining Using Single Shot Femtosecond Bessel Beams", Applied Physics Letters, American Institute of Physics, US, vol. 97, Issue 8, pp. 081102-081102-3, Aug. 23, 2010.
(Continued)

*Primary Examiner* — Sonya D McCall Shepard
(74) *Attorney, Agent, or Firm* — Moser Taboada (57) ABSTRACT

This invention provides an effective and a method of laser processing for separating semiconductor devices formed on a single substrate (6) or separating high thickness, hard and solid substrates (6), which is rapid. During preparation of the device or substrate (6) for the cleaving/breaking/dicing procedure an area of damage (8, 11) is achieved by obtaining deep and narrow damage area along the intended line of cleaving. The laser processing method comprises a step of modifying a pulsed laser beam (1) by an focusing unit (1), such as that an "spike"-shaped beam convergence zone, more particularly an above workpiece material optical damage threshold fluence (power distribution) in the bulk of the workpiece (6) is produced. During the aforementioned step a modified area (having a "spike"-type shape) is created. The laser processing method further comprises a step of creating a number of such damage structures (8, 11) in a predetermined breaking line by relative translation of the workpiece (6) relative the laser beam (1) condensation point.

14 Claims, 5 Drawing Sheets

(51) Int. Cl.
*B23K 26/0622* (2014.01)
*B23K 103/00* (2006.01)

(56) References Cited

OTHER PUBLICATIONS

International Search Report and Written Opinion dated Jul. 10, 2015 for PCT Application No. PCT/IB2014/065274.

METHOD OF LASER PROCESSING FOR SUBSTRATE CLEAVING OR DICING THROUGH FORMING "SPIKE-LIKE" SHAPED DAMAGE STRUCTURES

FIELD OF INVENTION

The present method relates to laser material processing. More particularly it relates to methods for cleaving and/or dicing hard and brittle materials with a specially shaped laser beam. The invention is useful for separating semiconductor devices formed on a substrate.

BACKGROUND OF INVENTION

Wafer dicing plays a critical role in the fabrication of semiconductor devices, devices which are becoming ever smaller and more complex. The classical methods of dicing are based on the use of a diamond saw for silicon wafers thicker than 100 µm or by laser ablation if they are thinner.

Diamond disk saw technology is limited by its low processing speed (for hard materials). The diamond disk saw produces wide, chipped kerf and low quality edge in general, which in turn degrades device yield and lifetime. The technology is expensive, due to rapid diamond disk degradation, and unpractical owing to the need for water cooling and cleaning. Additionally, the performance is limited when the substrate that is being cut is thin.

Another classical laser processing technology, namely laser ablation, is also limited by its low processing speed and a kerf width which reaches 10-20 µm and is too wide for most applications. Furthermore, laser ablation induces cracks, leaves melted residuals and contaminates the cutting area with debris. A wide area heat affected zone can reduce the lifetime and effectiveness of a semiconductor device.

Together with ablation the diamond disk saw technique can not be used for specialty wafers where there may be other surface features, such as dye-attached films for adhesive stacking. Such additions make the traditional sawing or ablation processes more difficult and vulnerable to debris. In order to improve the quality of separated devices other laser processing based methods and apparatus have been developed.

One of which is a laser processing and laser processing apparatus described in a U.S. Pat. No. 6,992,026, published on 31 Jan. 2006. The said method and apparatus allows cutting a work-piece without producing traces of fusion and cracking perpendicularly extending out of a predetermined cutting line on the surface of the work-piece. The surface of the work-piece is irradiated with a pulsed laser beam according to the predetermined cutting line under conditions sufficient to cause multi-photon absorption, where the beam is aligned to produce a focal spot (or condensed point: a high energy/photon density zone) inside the bulk of the work-piece, consequently forming modified area along the predetermined cleaving line by moving the focal spot in the cleaving plain. After creating the modified area the work-piece can be mechanically separated with a relatively small amount of force.

The said processing method and its variations are currently known in the art as "stealth dicing". All its variations are based on production of internal perforations by a focused pulsed laser beam at a wavelength for which the wafer is transparent, but which is absorbed by nonlinear processes at the focus, e.g. as in the internally etched decorative blocks of glass. The internal perforation leaves the surface top and bottom pristine. The wafers are usually placed on a plastic adhesive tape that is mechanically stretched causing the perforations to crack. It is claimed that no debris, surface cracking or thermal damage, occurs unlike with prior processes. In addition to specialty and multi-layer wafers, microelectromechanical (MEM) system devices can also be separated this way.

The disadvantages of stealth dicing become apparent as, typically, in order to perform Stealth Dicing a high numerical aperture (NA) lens must be applied, which results in a small depth of focus (DOF) and provides tight focusing conditions. This results in multiple cracks extending to random directions on the surface of cleaving and affects the lifetime of devices produced from of said cleaved wafers. Also, stealth dicing has it's draw backs when processing sapphire. These specific disadvantages are not apparent when wafers and substrates are of thicknesses of up to ~120-140 µm and only require one pass per separation line to be diced. However, for thicker wafers (usually 4"; 6" sapphire wafers are >140 µm to 250 µm or more), a number of passes per separation line are required. As a consequence, the material is exposed to laser radiation for prolonged periods of time which has unfavorable influence to final device performance and yield. In addition, multi-pass processing slows down the total processing speed and throughput.

Another method for material processing is disclosed in a US patent application No. US2013126573, published on 23 May 2013. A method is provided for the internal processing of a transparent substrate in preparation for a cleaving step. The substrate is irradiated with a focused laser beam that is comprised of pulses having a pulse energy and pulse duration selected to produce a filament within the substrate. The substrate is translated relative to the laser beam to irradiate the substrate and produce an additional filament at one or more additional locations. The resulting filaments form an array defining an internally scribed path for cleaving said substrate. Laser beam parameters may be varied to adjust the filament length and position, and to optionally introduce V-channels or grooves, rendering bevels to the laser-cleaved edges. Preferably, the laser pulses are delivered in a burst train for lowering the energy threshold for filament formation, increasing the filament length, thermally annealing of the filament modification zone to minimize collateral damage, improving process reproducibility, and increasing the processing speed compared with the use of low repetition rate lasers.

The application of this method results in rough processing applicable only to bare materials and is inconvenient for dicing owing to higher pulse energies required, which leads to unfavorable impact on final semiconductor device performance. In particular, if wafers are diced using this method, resulting light-emitting diodes (LED) are characterized by an increased leakage current, which is in case of high brightness (HB) and ultrahigh brightness (UHB) LEDs strongly reduces performance.

Another US patent application No. US2012234807, published on 20 Sep. 2012, describes a laser scribing method with extended depth affectation into a work-piece. The method is based on focusing of a laser beam in such a way that intentional aberrations are introduced. The longitudinal spherical aberration range is adjusted to be sufficient to extend depth of focus into a work-piece with a limited transverse spherical aberration range. The method also results in rough processing by high energy pulses to obtain vertical damage traces inside the work piece. High pulse energy is necessary due to the fact that a low numerical aperture lens (having a focal length of tens of millimeters)

must be used, which results in loose focusing conditions—the focal spot has a very smooth spacial intensity profile, therefore resulting in operation conditions where above damage threshold energy density is achieved in a large area with a relatively small peak value. Due to the increased requirements for pulse intensity (needed for optical breakdown) an increase in pulse energy is required and makes the processing unattractive for HB and UHB LED where LED leakage current and chip wall rough cracking is critical as mentioned above.

Prior art methods impose limitations on substrate thickness, material type and processing quality used for wafer separation. In order to process thicker materials the above mentioned technologies require an increase in laser power or number of laser beam passes per separation line. As a consequence, this has advert effects both to the semiconductor device performance and the yield of production.

SUMMARY

In order to eliminate the drawbacks indicated above, this invention provides an effective and rapid laser processing method for separating semiconductor devices formed on a single substrate or separating high thickness, hard and solid substrates. During preparation of the device or substrate for the cleaving/breaking (dicing) procedure an area of damage is achieved that is characterized by the obtained deep and narrow damage area along the intended line of cleaving. The present method does not require multiple laser beam passes for per cutting line therefore increasing the yield of production. Henceforth the term "workpiece" will be defined to include the terms substrate, wafer, wafer sheet, device or similar item that is prepared for processing and subsequent mechanical separation and will be used interchangeable.

The laser processing method comprises a step of modifying a pulsed laser beam by an focusing unit, in which the beam divergence and width are adjusted and focusing onto an workpiece is performed, such as that an "spike"-shaped beam convergence zone, more particularly an above workpiece material optical damage threshold fluence (power distribution) in the bulk of the workpiece is produced. The material is partially or completely transparent to the wavelength of said laser radiation and during the aforementioned step due to multiphoton absorption, preferably under sufficient conditions to produce localized melting or Coulomb explosions, a modified area (having a "spike"-type shape), also referred to as damage structure, in the bulk of the material is created.

The laser processing method further comprises a step of creating a number of such damage structures in a predetermined breaking line by relative translation of the object relative the laser beam condensation point. It should be apparent to a person skilled in the art that after forming such line the object can be separated or cut in to two or more smaller pieces having a defined separation boundary, defined by the sequence of damage areas, by employing mechanical force.

DESCRIPTION OF DRAWINGS

In order to understand the method better, and appreciate its practical applications, the following pictures are provided and referenced hereafter. Figures are given as examples only and in no way should limit the scope of the invention.

DETAILED DESCRIPTION OF PREFERRED EMBODIMENTS

This invention provides a laser processing method for separating semiconductor devices formed on a single substrate or separating hard and solid substrates. During preparation of a sample for the cleaving/breaking procedure an area of damage is achieved that is characterized by the obtained deep and narrow damage area along the intended line of cleaving.

Figure 1:
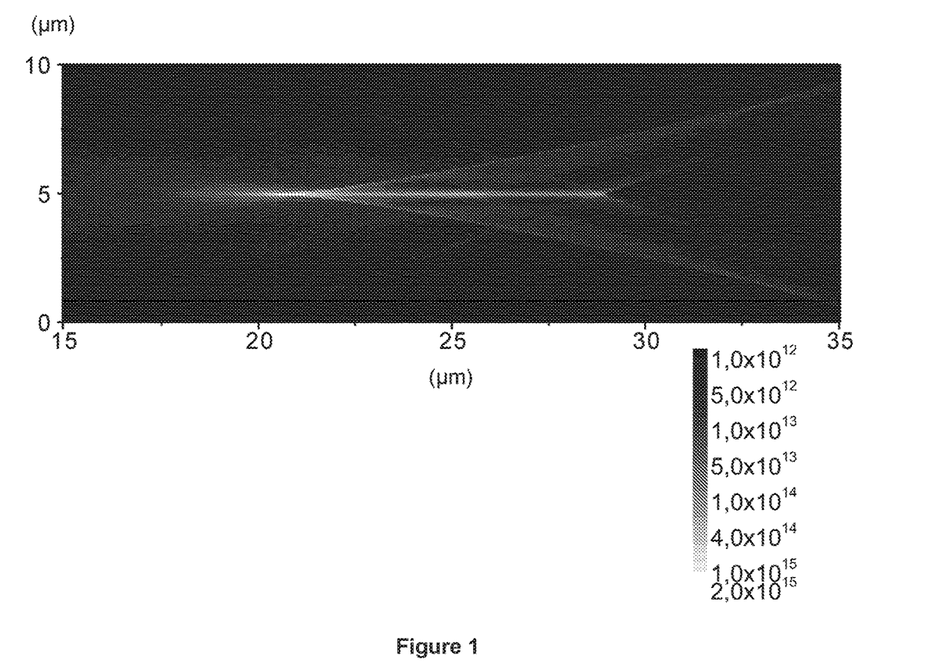
FIG. 1. is an illustrative view of numerically simulated "spike" shape focused laser beam intensity distribution inside material at 17-30 μm depth obtained by focusing incoming Gaussian profile intensity distribution laser beam (incident from left)
Figure 2:
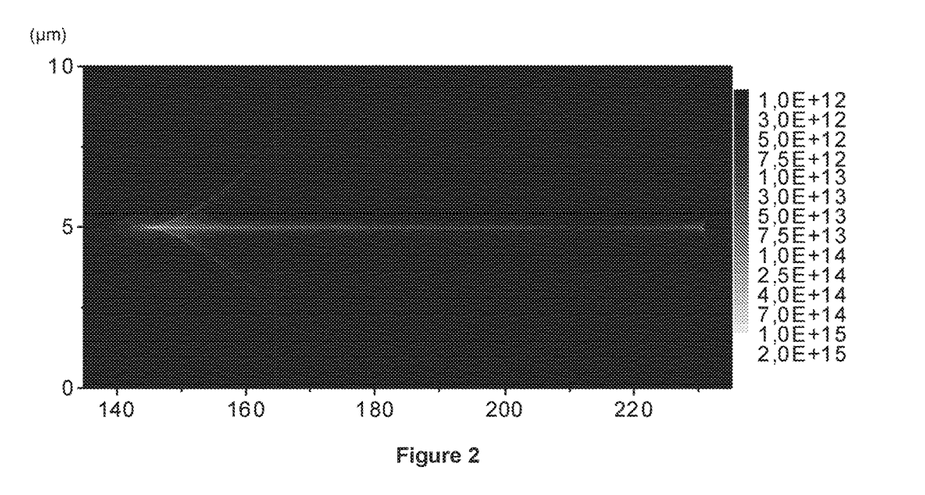
FIG. 2. is a view of numerically simulated "spike" shape focused laser beam intensity distribution inside material in the case of deeper focusing conditions (at 140-230 μm depth) obtained by focusing incoming Gaussian profile intensity distribution laser beam.

In the most preferred embodiment, the processing method comprises a step of irradiating a workpiece with a focused pulsed laser beam through a beam focusing unit in such a way that beam convergence zone (focal spot, focal point) is formed inside the bulk of the workpiece, creating damage structures matching or closely resembling the shape of the convergence zone. The convergence zone is formed in such a way that its spatial fluence distribution, where the fluence exceeds the damage threshold of the workpiece material, is the shape of a "spike"-like geometrical structure as exemplary shown in FIG. 1 or FIG. 2. The term "damage" is defined to refer to any kind of sufficient local modification of the material, by which the mechanical properties are altered enough to produce controlled crack (along the separation boundary) formation during later cleaving steps. The modifications, or damage structures (locally damaged zones, areas), are introduced by the mechanism of multiphoton absorption, which is possible if the workpiece material is partially or completely transparent to the central wavelength (material bandgap exceeds the energy of a single photon energy, preferably multiple times) of laser radiation used and sufficient photon densities achieved by using short and ultrashort pulses while employing beam focusing. It is preferred that the workpiece material features a ban gap energy above 0.9 eV.

The processing method further comprises repeated irradiation of the sample at spaced positions where a number of damage structures form a breaking/separation line. This is preferably achieved by mounting the workpiece on a motorized assembly of linear translation stages and moving the workpiece in a desired direction along the intended cleaving line, thus forming the cleaving plane. It should be apparent to a person skilled in the art the different configurations of translation stages can be employed, including rotational stages including mobilizing the focusing unit, as long the relative movement of focusing unit and workpiece is ensured. Sapphire, silicon carbide wafers, diamond substrates or other high hardness devices that are difficult to process mechanically can be used as the workpiece, especially when they feature high thickness (e.g. above 500 µm in thickness).

Figure 3:
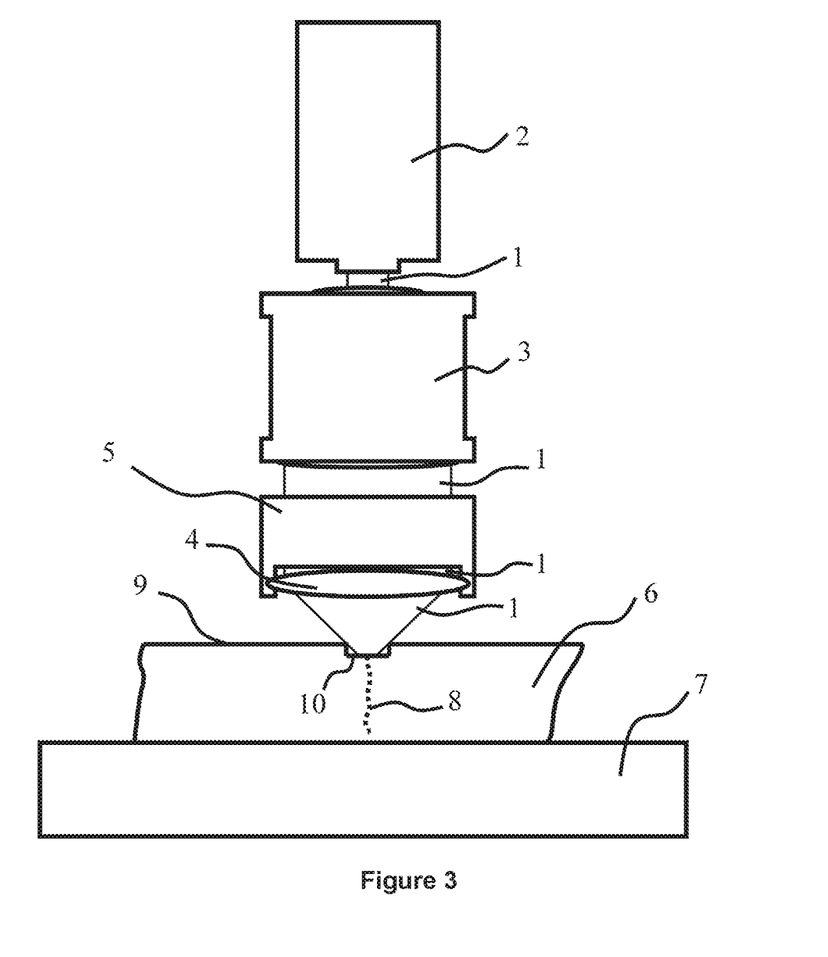
FIG. 3. is an schematic representation of preferred embodiment, wherein a single damage structure is produced by focusing laser radiation through the beam focusing unit.
Figure 4:
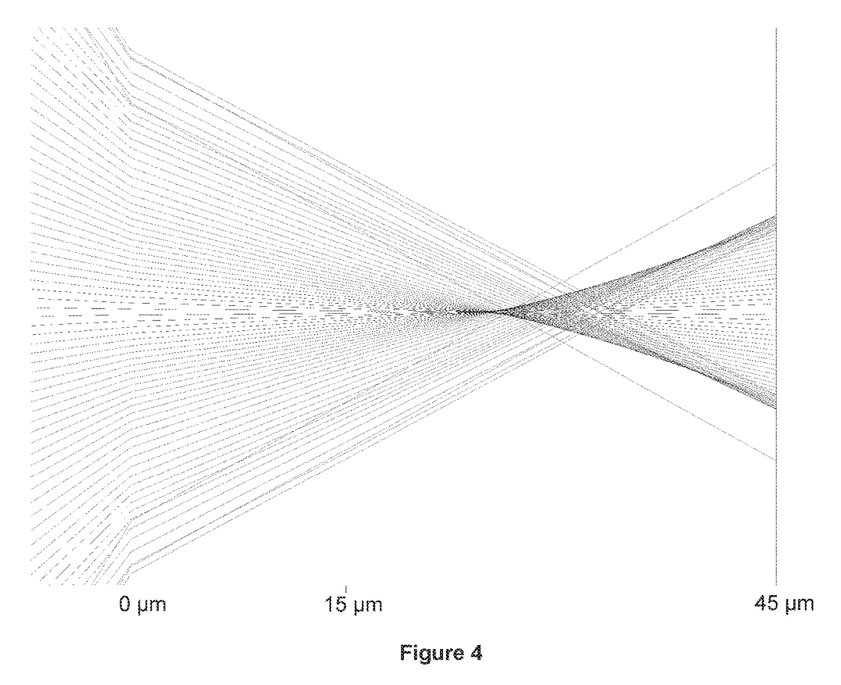
FIG. 4. is a view of numerically simulated paraxial and marginal laser ray focusing as achieved during focusing through the beam focusing unit inside material.

In the most preferred embodiment, the most appropriate way of realizing said steps is using a pulsed laser beam (1) source (2), preferably of a spherical-elliptical Gaussian intensity distribution, beam focusing unit (3,4,5), such as an arrangement of an beam shaping optics, e.g. beam expander (3), beam focusing element (4), means of stabilizing the distance between the beam focusing element (4) or unit (3, 4, 5) and the workpiece (6), as shown in FIG. 3, means for holding and translating (7) a workpiece (6), such a motorized translation stage assembly. Said pulsed laser beam source (2) is, preferably, a laser (2) capable of stably producing successive laser pulses of a constant polarization and having a well defined temporal envelope, preferably Gaussian, having a pulse duration set in the range of 100 to 15 000 fs, a central wavelength set in the range of 500 to 2000 nm, a frequency set in the range of 10 kHz to 2 MHz and a pulse energy sufficient to allow pulses behind the focusing unit (3,4,5) with a pulse energy in the range of 1 to 100 µJ and fluence in the range of 0.1 to 100 J/cm$^2$. Beam shaping optics (3), preferably comprise a beam expander (3), for example a Keplerian or Galilean type beam expander or any other configuration if necessary to achieve the proper beam width and divergence before the focusing element. The beam focusing element (4) preferably comprises an aspherical focusing (condensing) lens (4) or objective lens and preferably means of maintaining a preset distance between the lens and the sample, e.g. distance monitoring means with a piezoelectric nanopositioner or motorized linear translation stage (5), which maintains the distance between the beam focusing unit (3,4,5) and the workpiece (6) at the focusing element's (5) working distance, with a maximum amount of error up to approximately 2 µm for translation speed of 300 m/s. The beam focusing element (5) should be arranged in such a way that when the beam is focused into the bulk of the workpiece a "spike" shape focal spot (spatial distribution of the above damage threshold fluence) with a spacial high intensity distribution equivalent to and/or having the shape of a spike, and illustrated in FIG. 1 and also FIG. 3. Produced damage structures (8) can also be made to extend from the first surface (9) of the workpiece into the bulk, when necessary, e.g. by also inducing ablation (an ablation produced pit (10)) at the said surface (10). As the beam focusing element (4) an high numerical aperture is preferred (NA>0.7), but in other embodiments can be selected in the range from 0.5 to 0.9, and the design which allows on optical laser beam components that are closer to the optical axis (center of beam focusing element) to be focused in such a way that a condensation zone closer to the workpiece first surface (9) is produced in contrast to beam components propagating at a greater transverse distance to the optical axis, which are focused at a greater depth (distance form the first workpiece (6) surface (9)). An exemplary ray tracing image of said "spike" shaped convergence zone is shown in FIG. 4.

Figure 5:
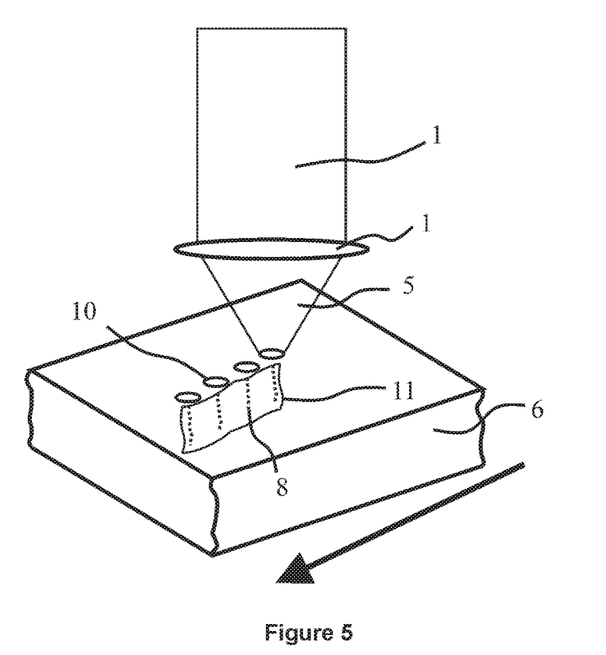
FIG. 5. is an schematic representation of preferred embodiment, wherein a series of damage structures are produced to form a cleaving/breaking plane.

The distance between each laser pulse delivered on the surface be in the range from 1 µm to 10 µm and can be adjusted by changing the motorized translation stage assembly (7) movement velocity. The cleaving/breaking (11) plane is formed by linear movement of motorized translation stage assembly (7). The number of passes (repeated translations) for a single cleaving line should be up to 2, nonetheless it is not limited, the process of creating the cleaving/breaking plane is shown if FIG. 5. In this case tight focusing and sharp "spike" shape focused intensity distribution are combined and can be controlled by manipulating aspherical lens parameters, material optical properties or incoming beam properties.

Figure 6:
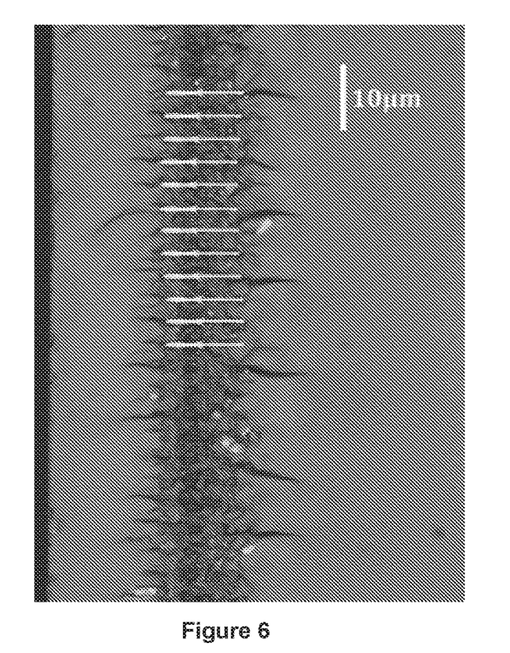
FIG. 6. is a view of a photograph comparing "spike" shape focused laser beam intensity distribution and damage shape obtained inside material at 17-30 μm depth.
Figure 7:
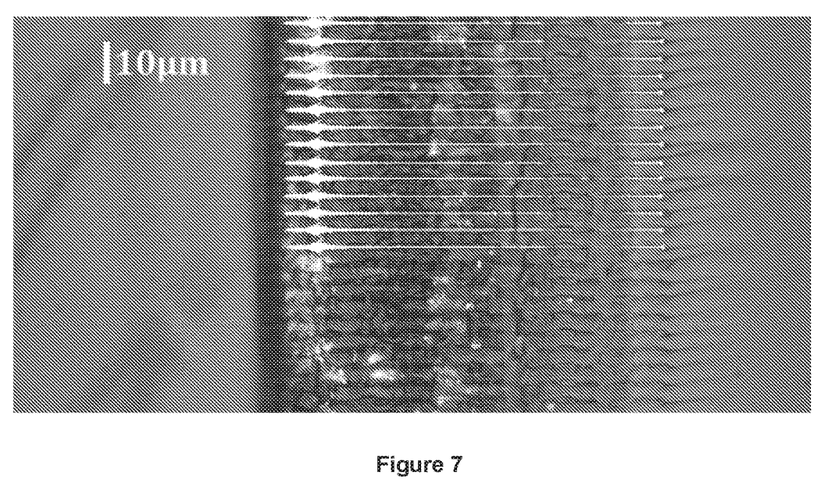
FIG. 7. is a view of a photograph comparing "spike" shape focused laser beam intensity distribution and damage shape obtained inside material in the case of deeper focusing conditions (at 140-230 μm depth)

The resulting topography of the cleaving/breaking surface is shown in FIGS. 6 and 7. It should be apparent to a person skilled in the art that different lengths of damage structures can be achieved to produce effective breaking of complex workpieces.

In another preferred embodiment, the same beam focusing unit (3,4,5) is employed to simultaneously focus up to 4 laser beams in order to produce multiple condensation points thus increasing processing speed.

In another embodiment, during the step of irradiating a workpiece with a focused pulsed laser beam through a beam focusing unit, the beam focusing unit is arranged to include at least one diffraction element, augmenting or replacing the beam shaping optics, that shapes the incoming beam in such a way that after the beam passes through the beam focusing element the "spike"-shaped intensity distribution is achieved.

Yet in another embodiment, during the step of irradiating a workpiece with a focused pulsed laser beam through a beam focusing unit, the beam shaping element is arranged to include at least one adaptive optics member that shapes the incoming beam in such a way that after the beam passes through the beam focusing element the "spike"-shaped intensity distribution is achieved. This allows using a larger variety of incoming beams (or more particularly differently modulated beams) or allow compensation for fluctuating processing parameters. The beam shaping member can be based on Deformable Mirrors, Piezoelectric Deformable Mirrors or similar.

Yet in another embodiment, during the step of irradiating a workpiece with a focused pulsed laser beam through a beam focusing unit, with accordance with the previous embodiment the adaptive optics member can be substituted with at least one phase and/or amplitude modulator member such as Liquid Crystal Light Modulator or micro-mirror matrix.

In order to better disclose the present invention the following examples are provided. Nonetheless, the disclosed examples and the mentioned parameters are provided to help understand the invention better and in no way limit its extent. These parameters can be changed in a wide interval, reproducing similar or different results, yet the main concept of the dicing process remains the same.

Yet in another embodiment, during the step of irradiating a workpiece with a focused pulsed laser beam through a beam focusing unit, with accordance with a previous embodiment the adaptive optics member can be substituted with at least one passive diffractive element beam modulating element, such as a flat-top beam shaping diffractive optical element, diffractive optical elements for aberration correction or another element, an all cases of appropriate parameters. The passive diffractive element is selected by a person skilled in the art in such a way that a beam, modulated with such an element, can be focused with the beam focusing element achieving a "spike"-shaped intensity distribution. It should be noted that the said element can also be arranged in the optical path after the beam focusing element during irradiation.

In order to better disclose the present invention the following examples are provided. Nonetheless, the disclosed examples and the mentioned parameters are provided to help understand the invention better and in no way limit its extent. These parameters can be changed in a wide interval, reproducing similar or different results, yet the main concept of the dicing process remains the same.

Example 1

Figure 8:
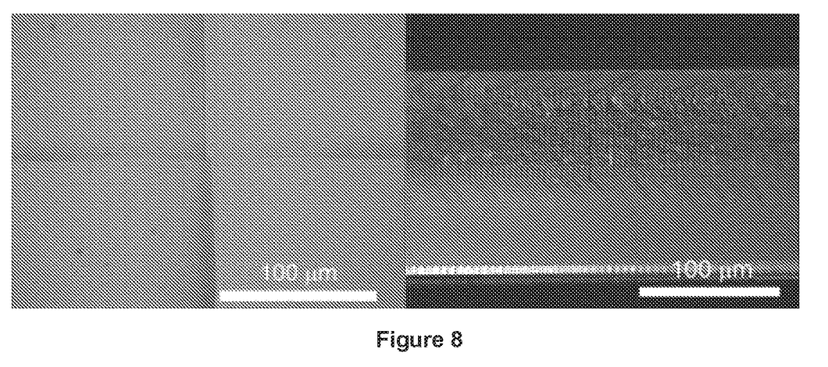
FIG. 8. is a view of processing results for with accordance to implementation Example 1.

Workpiece material is $Al_2O_3$. The workpiece is in the form of a substrate (slab) with a thickness of approximately 140 μm. The laser source is a femtosecond laser having an output radiation wavelength 1030 nm, pulse width below 300 fs (full width at half maximum/1.41), set at an output frequency of 100 kHz. The focusing unit is arranged with a 0.8 NA focusing objective lens, as the beam focusing element. Pulse energy after the beam focusing unit is selected to be 5 μJ and fluence approximately 0.7 $kJ/cm^2$, condensation zone is formed 10 μm below the first surface of the wafer. Distance between damage structures is 3 μm. Processing speed, more particularly the translation speed of the linear translation stage, 300 mm/s. Results after processing (left) and after breaking/dicing (right) are shown in FIG. 8.

Example 2

Figure 9:
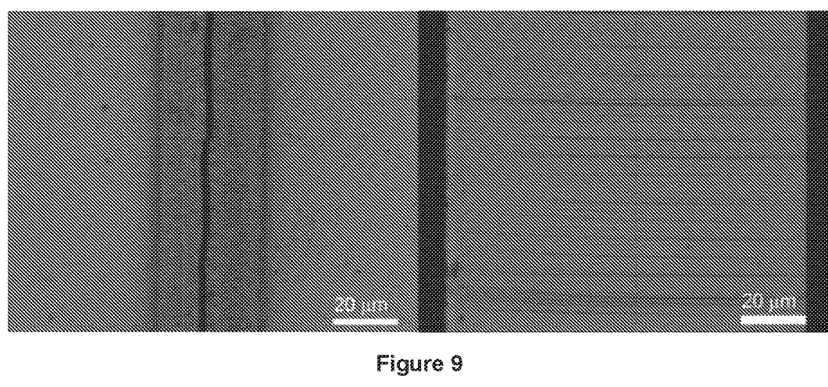
FIG. 9. is a view of processing results for with accordance to implementation Example 2.

Workpiece material is Silicon carbide, 4H polytype (4H-SiC). The workpiece is in the form of a substrate (slab) with a thickness of approximately 100 μm. The laser source is a femtosecond laser having an output radiation wavelength 1030 nm, pulse width below 300 fs (full width at half maximum/1.41), set at an output frequency of 100 kHz. The focusing unit is arranged with a 0.5 NA focusing objective lens, as the beam focusing element. Pulse energy after the beam focusing unit is selected to be 30 μJ and fluence approximately 1 $kJ/cm^2$, condensation zone is formed 30 μm below the first surface of the wafer. Distance between damage structures is 3 μm. Processing speed, more particularly the translation speed of the linear translation stage, 300 mm/s. Results after processing (left) and after breaking/dicing (right) are shown in FIG. 9.

Example 3

Lens aspherical coefficients have some freedom to choose, depends on incident beam divergence and targeting focusing depth interval. In the case of incident beam divergence—1 mRad (as measured behind the beam divergence control unit), targeting focusing depth inside sapphire interval from 17 μm to 140 μm, aspheric lens coefficients are for first lens surface: R=2.75 (radius of curvature); k=−0.5426984 (conic constant, as measured at the vertex); nonzero coefficients $A_4=-3.1954606 \cdot 10^{-4}$; $A_6=-4.3977849 \cdot 10^{-5}$; $A_8=1.8422560 \cdot 10^{-5}$; $A_{10}=-1.5664464 \cdot 10^{-6}$ and for second surface: R=−3.21; k=−12.41801; $A_4=9.0053074 \cdot 10^{-3}$; $A_6=-1.3597516 \cdot 10^{-3}$; $A_8=1.1366379 \cdot 10^{-4}$; $A_{10}=-4.2789249 \cdot 10^{-6}$; refractive index n=1.597, design wavelength 830 nm.

The invention claimed is:

1. A laser processing method for substrate cleaving or dicing, the method comprising:

irradiating a workpiece with a pulsed laser beam,
wherein the laser pulses are delivered on to a surface of the workpiece for cleaving,
wherein the workpiece is an object to be cleaved or diced with at least one flat surface,
wherein the workpiece is transparent for radiation of the pulsed laser beam, wherein a series of damaged structures produce a vertical cleaving plane aligned with an intended line of workpiece separation,
wherein the produced vertical cleaving plane enables easy breaking along the intended line of workpiece separation, and
wherein the pulsed laser beam is modified with a beam focusing unit arranged to focus the pulsed laser beam into a bulk of the workpiece material, in such a way that optical damage threshold fluence distribution of the workpiece material follows a "spike-like" shape;
producing said series of damage structures in the shape of said "spike-like" shape fluence distribution, along the vertical cleaving plane; and
modifying the pulsed laser beam with at least one beam focusing element, having a numerical aperture in the range of 0.8-0.9 NA, wherein the pulsed laser beam fluence is in the range of 0.1 to 100 $J/cm^2$.

2. The method according to claim 1, wherein said pulsed laser beam focusing by said beam focusing unit is achieved by guiding the beam through at least one beam divergence control unit arranged in the beam focusing unit, such as an adjustable beam expander, and in succession guiding said beam through at least one beam focusing element, whereby the beam focusing element is an a spherical beam focusing lens or an at least one objective lens.

3. The method according to claim 1, wherein said beam focusing element focuses said beam in such a way that transverse beam components that are incident on a surface of the focusing element closer to an optical axis are focused closer to a first workpiece surface, whereas the transverse beam components that are incident on the surface of the focusing element further from the optical axis are focused further in the bulk of the workpiece material relative to the first workpiece surface.

4. The method according to claim 1, wherein means for maintaining the distance is arranged to contain distance monitoring means, a piezoelectric nanopositioner or a motorized linear translation stage.

5. The method according to claim 1, wherein said "spike-like" shaped focused laser beam intensity distribution inside material is adapted for effective processing with regard to the properties of the material and said workpiece dimensions by at least one of changing laser beam divergence before said focusing element, focusing element surface design, focusing depth, by means of an actuator unit.

6. The method according to claim 1, wherein said laser beam focusing by said beam focusing unit is achieved by guiding the beam through at least one adaptive optics member in the beam focusing unit and in succession guiding said beam through at least one beam focusing element, such as a spherical or a spherical beam focusing lens or an at least one objective lens.

7. The method according to claim 1, wherein that said laser beam focusing by said beam focusing unit is achieved by guiding the beam through at least one phase and/or amplitude modulator member in the beam focusing unit and in succession guiding said beam through at least one beam focusing element, such as a spherical or a spherical beam focusing lens or an at least one objective lens.

8. The method according to claim 1, wherein said laser beam focusing by said beam focusing unit is achieved by guiding the beam through at least one passive diffractive element beam modulating element in the beam focusing unit and at least one beam focusing element, such as a spherical or a spherical beam focusing lens or an at least one objective lens.

9. The method according to claim 1, wherein said laser beam wavelength is in the range of 500 to 2000 nm.

10. The method according to claim 1, wherein said laser pulse duration is in the range of 100 fs to 15000 fs.

11. The method according to claim 1, wherein said laser pulse repetition rate is in the range of 10 kHz to 2 MHz.

12. The method according to claim 1, wherein said laser pulse energy is in the range of 1 to 100 microjoule.

13. The method according to claim 1, wherein a distance between the damage structures in said series of damage structures lies in the range from of 1 to 10 micrometers.

14. The method according to claim 1, wherein the workpiece is made of one of sapphire, silicon carbide or diamond.

* * * * *